United States Patent [19]

Leach

[11] 4,161,791
[45] Jul. 17, 1979

[54] AUTOMATIC REFRESH MEMORY CELL

[75] Inventor: George S. Leach, Phoenix, Ariz.

[73] Assignee: Electronic Memories & Magnetics Corporation, Encino, Calif.

[21] Appl. No.: 937,180

[22] Filed: Aug. 28, 1978

[51] Int. Cl.² .................................. G11C 11/40
[52] U.S. Cl. .................................. 365/222; 365/149; 365/182; 307/238
[58] Field of Search ............. 365/102, 149, 150, 182, 365/183, 184, 222; 307/238, 279

[56] References Cited

U.S. PATENT DOCUMENTS

| | | | |
|---|---|---|---|
| 3,979,734 | 9/1976 | Parker et al. | 365/149 |
| 4,122,550 | 10/1978 | Caywood | 365/149 |

Primary Examiner—Terrell W. Fears
Attorney, Agent, or Firm—Kleinberg, Morganstern, Scholnick & Mann

[57] ABSTRACT

A simple, three element, charge pumped, automatic refresh dynamic storage RAM cell is disclosed. Information is represented by the charge of the capacitance coupling to the substrate. The storage junction gates a transistor enabling the application of a refresh signal to the gate of a refresh capacitor element whenever the charge state represents a first value. The refresh signal pumps charge (electrons) from the storage junction through the refresh capacitor to maintain the junction voltage at a level sufficient to continue representing the storage of a first valued signal.

10 Claims, 3 Drawing Figures

AUTOMATIC REFRESH MEMORY CELL

BACKGROUND OF THE INVENTION

1. Field of the Invention

The present invention relates to semiconductor memories and more particularly, to an integrated circuit, three-element, charge pumped, automatic refresh, dynamic storage, random access memory cell.

2. Description of the Prior Art

In the prior art, semiconductor random access memories are well known. Dynamic semiconductor memories utilize charge stored in the capacitance between the device and the substrate to represent a particular value of information being stored. In order to retain the information in storage, it is then necessary to counteract the effect of the various leakage phenomena which cause the value of the stored charge to change.

The prior art has solved this problem by utilizing various "refreshing" schemes. Dynamic Random Access Memory Cells are described in some detail in Chapter 5, Section 5.3 from pages 120-124, in the volume "Semiconductor Memory Design and Application" by G. Luecke et al., published by McGraw-Hill Book Company as a part of the Texas Instruments Electronics Series.

The prior art has also disclosed the use of a phenomenon known as "charge pumping" in a random access memory cell. One such example has been disclosed in "Semiconductor Memory Design and Application", supra, at page 132, Section 5.6.2, pages 132-134, in which the charge pump phenomenon was employed in a crosscoupled RAM cell utilizing semiconductor load devices. A charge pump supply provided a constant current supply which was deemed to be an ideal load device, and which could be achieved with minimum geometry while still retaining the high load resistance.

In a paper delivered to the 1976 IEEE International Solid State Circuits Conference in February, 1976 and reported in the digest of technical papers at pages 132 and 133, an Automatic Refresh Dynamic Memory was disclosed by authors Harry J. Boll, et al. of the Bell Laboratories. This automatic refresh cell comprised approximately six devices, although an experimental device appeared to utilize only five. The circuit operated at voltages of from 6 to 8 volts on the refresh line.

An interesting variation on the dynamic RAM cell was described in Section 5.6.3 of the Luecke et al. book, supra, at pages 134, 135. A three transistor MOS cell, originally disclosed by Walther and McCoy in ISSCC 1972, Digest of Technical Papers, pp. 14-15, utilized the parasitic gate capacitance to "refresh" a storage capacitor during each read-write cycle. The use of the parasitic gate to substrate capacitance as the storage element in a three transistor dynamic MOSFET cell was described in the book "Physics of Computer Memory Devices" by Middelhoek, et al., published by Academic Press.

It is a continuing goal of designers to produce a random access memory device of low power, high speed, and small size, which can most efficiently utilize the available semiconductor substrate. Further, it has been deemed desirable to have such devices operating at voltages in the range of 5 volts or less. Obviously, the polarity of the operating voltages is a function of the technology to be employed, whether it be n-channel or p-channel.

SUMMARY OF THE INVENTION

According to the present invention, an improved, three-element random access memory cell is provided which dynamically stores information in the gate to substrate capacitance and which, through the phenomenon of charge pumping a semiconductor capacitor, employs a periodic refresh signal to restore any charge which leaks to the storage node between successive applications of the refresh signal.

In the preferred embodiment, a storage cell utilizes two enhancement mode MOS field effect transistors (MOSFET), and one depletion mode capacitor. The coincident information lines which select a particular storage element in a matrix are coupled to a gate and one of the source and drain of a first transistor. The other of the source and drain connects to a junction, the voltage of which represents the value of an information bit stored in the cell.

The storage junction is coupled to the gate of a refresh transistor and to the connected source and drain of a capacitor. The gate of the capacitor is coupled to one of the source and drain of the refresh transistor, the other of which is connected to a source of refresh signals. In the preferred embodiment, the refresh signal is a sinusoidal signal of approximately 5 volts peak-to-peak operating between 0 and 5.0 volts.

In operation, 5.0 volts on the word and bit lines causes approximately 4.0 volts to be stored on the junction which includes the first capacitor and which has an effective capacitance to substrate. This voltage is sufficient to bias the refresh transistor into conduction so that the refresh signal can then be applied to the gate of the first capacitor. Between each refresh cycle, charge, in the form of electrons, will be leaking onto the storage node of the capacitor, causing the original 4.0 volts to drop slightly. As long as the refresh signal is applied before leakage drops the voltage below the conduction (threshold) voltage of the refresh transistor, the charge pumping phenomenon will take place, pumping electrons off the storage node and back into the substrate, and thus causing the voltage on the storage node to rise.

When a "0" is stored, represented by a low voltage at the junction, the refresh transistor remains gated off and the refresh signal cannot be applied to the capacitor. Since a stored "1" (high voltage resulting from a depleted electron population) tends to leak, it is important that the refresh signal be applied before the voltage at the storage junction falls below a value that maintains the refresh transistor conductive.

The cell of the preferred embodiment can readily be employed in a multibit random access memory and can be arranged in a matrix where, for example, row enabling signals might correspond to the word line and column enabling signals would correspond to the bit line thereby permitting a unique selection of a cell within a matrix by appropriate energization of the row and column lines. The refresh signal is applied simultaneously to all cells in the matrix. All cells containing a positive charge as a result of a depleted electron population are then given an incremental positive charge increase as a result of charge pumping out additional electrons until the voltage at the storage node reaches a level that suppresses the charge pumping process. This is believed to be caused by the effective change of capacitance resulting from the formation of the inversion layer.

DESCRIPTION OF THE PREFERRED EMBODIMENTS

Figure 1:
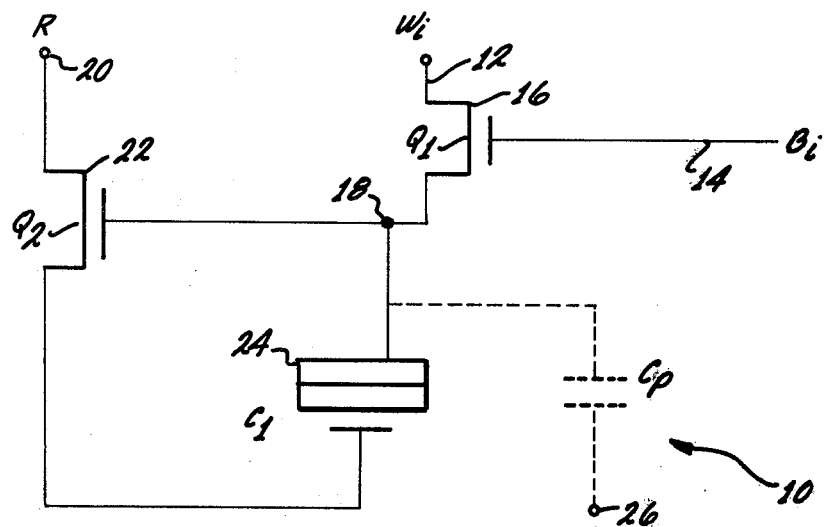
FIG. 1 is a circuit diagram of a memory cell according to the present invention.

Turning first to FIG. 1, there is shown in schematic form, a typical random access memory cell 10 according to the present invention. Since the present cell is intended to work in a matrix configuration, information is applied to the cell through the use of a first or word line 12, here designated $W_i$ and a second or bit line $B_i$ 14.

In the preferred embodiment, which utilizes n-channel technology, the word line is shown coupled to the drain of a first $Q_1$ MOSFET 16. The bit line 14 is coupled to the gate of $Q_1$ 16 and the source is connected to a storage junction 18.

A source of refresh signals 20 is coupled to the drain of a refresh $Q_2$ MOSFET 22, the gate of which is coupled to the storage junction 18. The MOSFET elements are, in the preferred embodiment, enhancement mode devices. A depletion mode, MOS capacitor $C_1$ 24 is connected via the source/drain to the junction 18, and the gate is coupled to the source of the $Q_2$ MOSFET 22.

Indicated in dotted lines, is a second capacitor $C_p$ 26 which is shown coupled to a source of reference potential $V_s$ 28 and represents the diffusion to substrate or parasitic capacitance of the device. If a negative back bias is applied to the substrate, the reference potential will be at that voltage.

If a ground plane or bus is provided that is in proximity to the diffusion, there may be a first capacitance to ground and a second capacitance to the substrate. In the absence of a bias, the reference potential is ground.

In the preferred embodiment, utilizing n-channel MOS technology, a positive, 5.0 v. represents a binary "1" while 0 v. represents a binary "0". Accordingly, when it is desired to store a "0" bit, the word line $W_i$ 12 will be at ground when the bit line $B_i$ 14 has a 5.0 v. signal applied thereto. This biases the $Q_1$ transistor 16 into conduction and the voltage on the word line $W_i$ 12 is applied to the storage junction 18.

Since the word line $W_i$ 12 voltage is substantially 0, no potential difference is applied to the junction 18, and therefore no positive potential is created in the parallel combination of the refresh capacitor $C_1$ 24 and the parasitic capacitance to the substrate $C_p$ 26. The bias applied to the gate of the refresh $Q_2$ transistor 22 is insufficient to cause a conduction in that device. Accordingly, the refresh signal from the source 20 does not appear at the gate of the refresh capacitor $C_1$ 24.

The cell is read by permitting the word line $W_i$ 12 to float. When the particular cell is selected by application of a 5.0 v. bias to the $B_i$ line 14, conduction is enabled in the $Q_1$ transistor 16. This causes the voltage on the storage junction 18 to appear on the word line $W_i$ 12. In this first example, that voltage is a 0, and accordingly, the output of the cell would be a "0" representing signal.

In order to write a "1" into the cell 10, a 5.0 v. level is applied to the word line $W_i$ 12. When the bit line $B_i$ 14 is selected, its voltage rises to 5.0 v., turning on the $Q_1$ transistor 16. The 5.0 v. appearing on the word line $W_i$ 12 is then applied to the junction 18. Both the refresh capacitor $C_1$ 24 and the parasitic capacitor $C_p$ 26 are charged by removing electrons to a voltage approximately equal to 5.0 v. less the threshold of the transistor $Q_1$ 16, or a nominal 4.3 volts. The cell is designed so that the capacitance of the refresh transistor $C_1$ 24 is on the same order of magnitude as the parasitic capacitor $C_p$ 26. However, $C_1$ 24 is made as small as possible to conserve "real estate".

At the end of the write cycle, the bit select line $B_i$ 14 is returned to 0, thereby turning off the $Q_1$ transistor 16. The positive voltage stored on the capacitors now begins to "leak," partially as a result of migration of electrons in the refresh capacitor 24 and partially from the normal leakage current in the parasitic capacitor 26.

So long as the magnitude of the voltage at the junction 18 is sufficient to gate the refresh transistor $Q_2$ 22 into conduction, the refresh signals are applied from the source 20 to the gate of the refresh capacitor $C_1$ 24.

The refresh signal, in the preferred embodiment is a sine wave having a 5.0 v. peak-to-peak magnitude which varies from 0 to 5.0 volts. The voltage applied to the gate of the refresh capacitor $C_1$ 24 can then range from 0 to some voltages less than 5.0 volts corresponding to the threshold of the refresh transistor $Q_2$ 22.

The refresh signal sees the series combination of the refresh capacitor $C_1$ 24 and the parasitic capacitance $C_p$ 26, which is effectively tied to the back bias potential. Accordingly, with a positively charged condition of the refresh capacitor, the voltage at the storage junction 18 is partially bootstrapped by application of the refresh signal, and can rise to voltages in excess of the roughly 4.3 volts to which the capacitor was initially charged.

The charge pumping phemonema is encountered when the voltage at the storage node 18 remains below a predetermined value, which, when reached, effectively biases "off" the current flow resulting from the charge pumping. Accordingly, during a portion of the refresh cycle, a charging current will flow into the parasitic capacitor $C_p$ 26, partially removing some of the electrons which had leaked back.

One explanation of the charge pumping phenomena is, of course, found in the book Semiconductor Design and Application, supra, at Section 5.6.2, pp 132, 133. Another possible explanation is that as the channel is formed and the inversion layer is created, the effective separation of the "plates" of the capacitor increases, thereby effectively changing the size of the capacitor. As a result, the capacitance of the refresh capacitor $C_1$ 24 when discharged is much greater than when the same capacitor is fully charged.

When the source of potential is removed from the capacitor, the inversion layer is slowly neutralized over time by the return of electrons and the value of capacitance approaches its maximum value. However, the combination time is relatively long to the period of the refresh signal.

If the rate of electron return is sufficiently slow, and the voltage on the storage node 18 remains above the cutoff voltage for charge pumping, a refresh cycle will merely drive the voltage at junction 18 through an excursion while electrons continue to leak into the parasitic capacitor.

If one plots the voltage at the storage junction 18 while a "1" is being stored, it will be seen that the curve representing the difference between the actual voltage at the junction and the excursion resulting from the application of a refresh signal, will be a decaying one, so long as the minimum is above the charge pumping cutoff point. If, however, the minimum falls below that cutoff point into the region of charge pumping, it will be seen that an incremental voltage increase results after each refresh cycle until the cutoff point is again reached.

Since the capacitance of the $C_1$ refresh capacitor 24 varies from a maximum value when discharged to a minimum value when charged with the voltage constant, as the capacitance changes, some positive charge remains. Depending upon the back bias, if any, applied to the substrate, the charge pumping phenomenon can be cut off with a voltage of approximately 3.5 volts on the storage junction 18.

The exact value of the cutoff point is a function of the threshold for the particular device. As the back bias of the device is increased, which is the bias applied to the substrate, then the threshold increases. Since the charge pumping phenomenon works best without a back bias, but since some back bias is often used to increase the threshold and add stability and reliability to the n-channel device, a compromise must be reached and some optimum combination of device parameters and substrate bias can be selected.

The nature of the refresh pulses has not been deemed significant and it is believed that the phenomenon can be employed satisfactorily with sine waves, square waves, sawtooth or even intermittent pulses, so long as the refresh is applied sufficiently often to prevent the storage junction 18 from gaining electrons to reduce the voltage to a value which is insufficient to maintain conduction in the $Q_2$ or refresh transistor 22.

Because the refresh capacitor $C_1$ 24 is small and because of the changing capacitance with stored positive charge, the refresh signal does not reduce the voltage of the storage junction 18 below the voltage at which the $Q_2$ or refresh transistor 22 cuts off. The voltage seen on the word line, depending upon the refresh cycle, will then range between approximately 3 volts and 6 volts.

In order to read a cell in which a "1" is stored, the word line $W_i$ 12 is, as before, permitted to float. A signal of approximately 5 volts is applied to the bit line $B_i$ 14 which gates on the $Q_1$ transistor 16. The voltage at the storage junction 18 then appears on the word line. Working with typical sense amplifiers, a signal as small as 3 volts is adequate to establish that a "1" has been stored in the cell.

Figure 2:
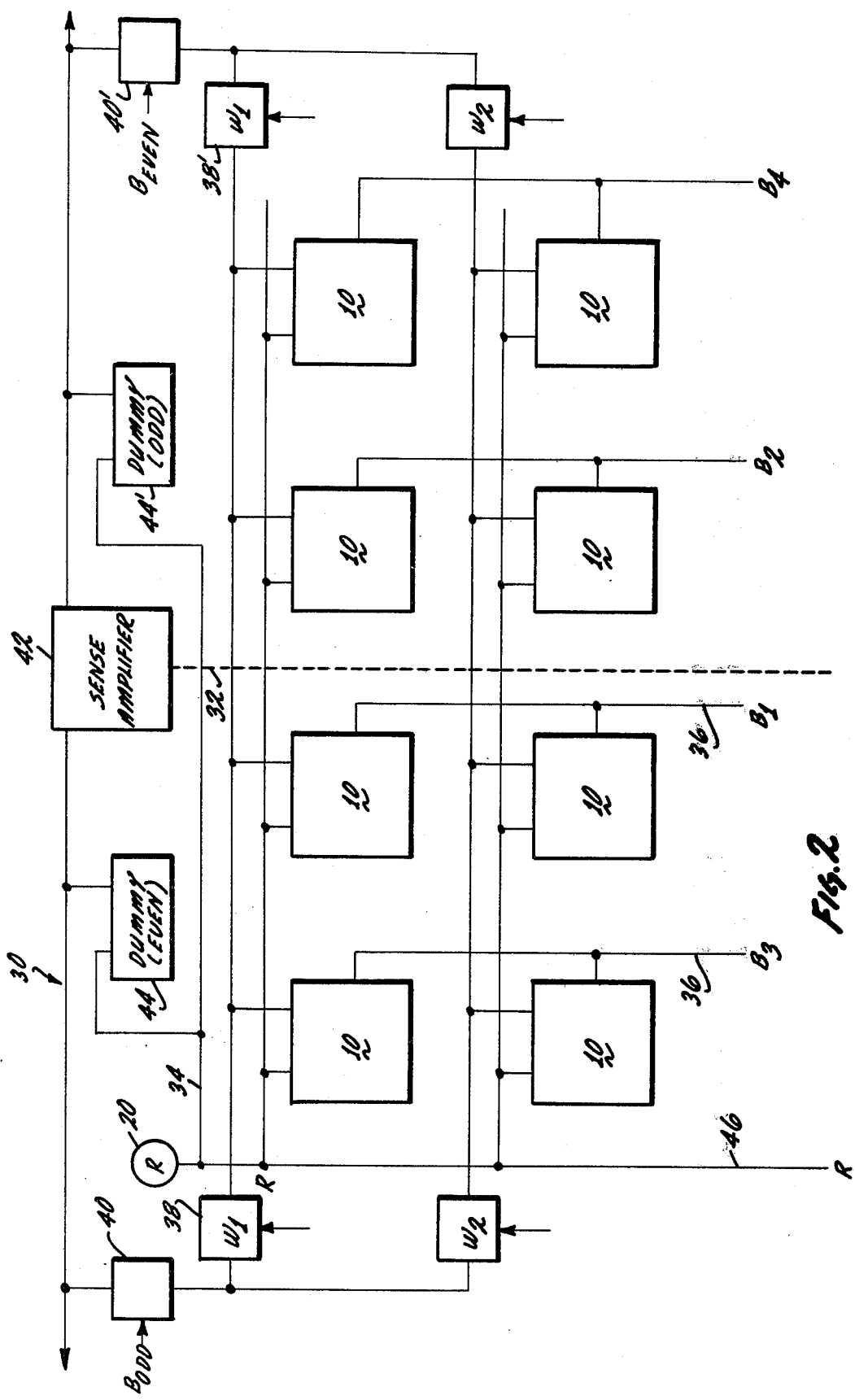
FIG. 2 is a diagram of a plurality of cells arranged in a matrix.

Turning next to FIG. 2, there is shown in diagrammatic form, a portion of a typical matrix memory 30 utilizing individual cells 10 of the present invention. A source of refresh voltage 20 is commonly connected to all of the cells in the matrix.

The memory is shown with four columns but only two rows on the assumption that the size could be extended without any difficulty. As shown, two word rows are illustrated, $W_1$ and $W_2$, while four bit columns are shown. The bit columns are arranged with the "even" bits to the right of an imaginary central line (indicated by the dashed line) while the "odd" numbered bits are to the left of the center line 32. All cells 10 in a row are commonly connected to the same word line 34 while all cells in a column are commonly connected to the same bit line 36.

The word lines 34 are connected both to a selection matrix and to a source of input data (not shown). However, within the memory 30 itself, each word line 34 includes a line select gate 38. Because the system is arranged in a symmetrical configuration, a line select gate 38 is located at the extreme left edge and another gate 38' is at the extreme right edge of the word line 34. Both line select gates 38, 38' are controlled by a signal from the word line select circuits (not shown) which enables one of the word lines of the matrix for a writing or reading of information.

A pair of odd/even gates 40, 40' couple the word line 34 to opposite halves of a sense amplifier 42. A $B_{odd}$ gate 40 is enabled when reading from one of the cells 10 in the "odd" half of the matrix while the other, $B_{even}$ select gate 40' is energized by the selection of an even numbered cell 10.

A pair of "dummy" memory cells 44, 44' are connected to the word lines going into the sense amplifier 42. On the left-hand side, a dummy (even) cell 44 is provided while on the right side a second dummy (odd) cell 44' is provided. Both dummy cells 44, 44' are substantially identical and each is intended to have a bit stored in it.

The dummy cells 44, 44' differ from regular memory cells 10 only in that they are approximately one half the size. The information stored therein would be considered equivalent to "$\frac{1}{2}$". As a consequence, whenever the memory is read, the sense amplifier 42 has applied to one side, a signal representing a "$\frac{1}{2}$", supplied by a dummy cell 44 and, on the other side, a signal representing either "1" or "0", which is supplied by the memory cell 10. At the end of each read cycle, the sense amplifier 44 supplies to the utilization circuits, an unequivocal signal, representing either a binary "1" or binary "0", depending upon the contents of the cell 10 interrogated.

To write into a cell 10, a signal representing the information to be stored, which in a preferred embodiment is 5.0 volts for a "1" and 0. volts for an "0", is placed on the word line 34 of the selected row. When the proper bit line 36 is energized with a 5.0 volt signal, a $B_{odd}$ or $B_{even}$ signal is also generated, depending upon whether the selected bit column is "odd" or "even".

The application of the bit line signal stores the contents of the word line in the selected cell 10. At the same time, a charge of smaller magnitude is resident in the dummy cell 44 on the "opposite" side. The refresh line 46 is applied to the dummy cells 44 as well as to all the other cells 10 of the memory 30.

Figure 3:
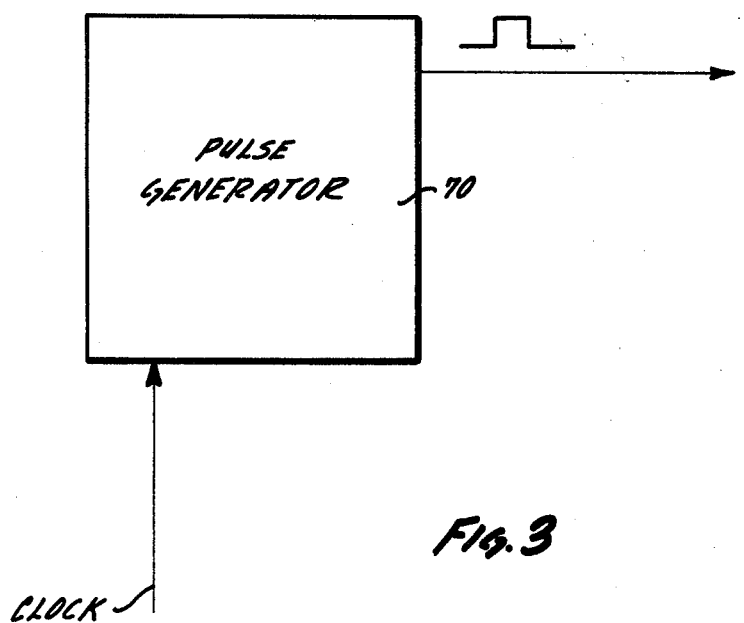
FIG. 3 is a diagram of an alternative source of refresh signals.

Turning finally to FIG. 3, there is shown, diagrammatically, a version of a refresh system which, rather than utilizing a sine wave generator to provide refresh pulses, uses a pulse generator which is triggered by a clock signal which occurs during each operating cycle. Depending upon the rate at which electrons drift back to the storage cell, it may be sufficient to supply a refresh pulse after each write cycle, or after each read cycle. If the diffusion to substrate capacitance is sufficiently small, then the refresh must be applied more frequently and may be required after each read cycle and write cycle, or some other arrangement may be required to assure the necessary reapplications of the refresh pulse to maintain the contents of the memory.

As shown in FIG. 3, a pulse generator 70, which may be a monostable multivibrator or one shot, is triggered by an application of a clock signal. Other pulse generators may be employed which can furnish pulses of predetermined magnitude and duration sufficient to supply the requisite power to restore, through the phenomenon of charge pumping in the refresh capacitor $C_1$ 24, the positive voltage which may have been diminished by electrons leaking to the memory cell.

A sense amplifier, which may be adopted for use in the memory 30 of the present invention, has been described and shown in the patent to Dennard, et al., U.S. Pat. No. 3,949,381, issued Apr. 6, 1976.

Thus, there has been disclosed a novel, three-element charge pumped, automatic refresh dynamic storage RAM cell. As with conventional devices, the information is stored in the diffusion to substrate capacitance and a field effect refresh capacitor, having a charge pumping capability, of approximately the same capacitance is provided to periodically restore an increment of "positive charge" or remove electrons, thereby maintaining a storage junction at a voltage sufficient to represent the storage of a binary "1". The voltage at the storage junction, when a "1" is stored, gates a refresh transistor into conduction so that a periodic refresh signal can be applied to the gate of the refresh capacitor.

Word and bit signals are applied to the source or drain and gate of a transistor, thereby requiring only a single transistor for a read or write operation. The cell of the present invention can be employed in a matrix of conventional design, thereby permitting the simple mechanization of a small 5.0 volt random access memory with modest power requirements.

While the invention has been shown utilizing MOSFET devices, it is believed that any actuable, switch type, device may be substituted for the data transistor $Q_1$ or the refresh transistor $Q_2$. Similarly, although the refresh capacitor has been described as a field effect device having a gate and a source and drain coupled together, it is believed that any insulated gate, diffusion device in which the gate was one electrode and the diffusion was the other electrode, with a capacitance between the electrodes, would exhibit a charge pumping property and therefore could be utilized. However, for relatively low voltage operation, a depletion mode MOSFET capacitor is employed.

Accordingly, the invention should only be limited by the scope of the claims appended hereto.

What is claimed as new is:

1. An integrated circuit, three element, stored charge, refreshed, semiconductor memory cell, comprising in combination:
   (a) a first actuable device adapted to couple a first selection line to a storage junction, and adapted to be controlled by a second selection line;
   (b) an integrated circuit field effect capacitor having an insulated gate electrode and a second electrode exhibiting substantial capacitance between said gate electrode and said second electrode, said second electrode being connected to said first actuable device at the storage junction and capable of charge pumping from one electrode to the other electrode thereof;
   (c) a second actuable device for receiving applied refresh signals and selectively coupling such refresh signals to said gate electrode of said capacitor, said second actuable device having a control electrode coupled to said storage junction and being responsive to the storage of a first valued signal at said storage junction to admit refresh signals to said capacitor gate electrode, and operable in response to the storage of a second valued signal to block application of refresh signals to said capacitor gate electrode;
   whereby refresh signals can pump charge through said capacitor to maintain the voltage at said storage junction representing the presence of a first valued signal.

2. The cell of claim 1, supra, wherein said first and second actuable devices are enhancement mode FET devices and said capacitor is a depletion mode device.

3. The cell of claim 1, supra, wherein said first and second actuable devices and said capacitor are n-channel field effect devices.

4. The cell of claim 3, supra, wherein said first and second actuable devices are enhancement mode devices.

5. The cell of claim 2, supra, wherein said first and second actuable devices are transistors with sources, drains and gates and wherein said first device drain is coupled to a word select line and said first device gate is coupled to a bit select line, said second device drain is coupled to a refresh signal line and said second device source is coupled to said capacitor gate electrode.

6. In an integrated circuit memory adapted to be coupled to a source of refresh signals, a source of word select signals and a source of bit select signals, a charge pumped storage cell comprising in combination:
   (a) a data transistor having a gate, source and drain; said gate being adapted to be coupled to a one of the source of word select and bit select signals, one of the source and drain being adapted to be coupled to the other of the source of word select and bit select signals;
   (b) an integrated circuit capacitor having a coupled source and drain and a gate, said source and drain being connected to the other of said data transistor source and drain, remote from the connection to the source of select signals, said capacitor having a capacitance between said gate and said source and drain when uncharged that is approximately the same order of magnitude as the diffusion to substrate capacitance; and
   (c) a refresh transistor having a gate, source and drain, one of said source and drain being connected to said capacitor gate, the other of said source and drain adapted to be connected to the source of refresh signals; said refresh transistor gate being coupled to said capacitor source and drain,
   said data transistor being responsive to simultaneous application of word and bit select signals for applying one of its select signals to the parallel combination of said capacitor and the diffusion to substrate capacitance, for storing a predetermined charge thereon and developing a voltage sufficient to bias said refresh transistor into conduction to apply a refresh signal to charge pump the series combination of said capacitor and the diffusion to substrate capacitance.

7. The cell of claim 6, supra, wherein said data and refresh transistors are enhancement mode FET devices and said capacitor is a depletion mode device.

8. The cell of claim 6, supra, wherein said data and refresh transistors and said capacitor are n-channel devices.

9. The cell of claim 8, supra, wherein said data and refresh transistors are enhancement mode devices.

10. The cell of claim 7, supra, wherein said data FET drain is coupled to the word select source and said data FET gate is coupled to the bit select source, said refresh FET drain is coupled to the refresh signal source and said refresh FET source is coupled to said capacitor gate.

* * * * *

UNITED STATES PATENT OFFICE
CERTIFICATE OF CORRECTION

Patent No. 4,161,791　　　　　　　　　　Dated Jul. 17, 1979

Inventor(s) GEORGE S. LEACH

It is certified that error appears in the above-identified patent and that said Letters Patent are hereby corrected as shown below:

Col. 3, line 30, after "lines" delete ",";

Col. 4, line 24, delete "voltages" and insert --voltage--;

Col. 4, line 34, change "phemonema" to --phenomena--.

Signed and Sealed this

Twenty-fifth Day of December 1979

[SEAL]

Attest:

*Attesting Officer*

SIDNEY A. DIAMOND

*Commissioner of Patents and Trademarks*